(12) United States Patent
Yokoyama (10) Patent No.: US 8,615,094 B2
(45) Date of Patent: Dec. 24, 2013

(54) AUTOMATIC LEVEL CONTROL CIRCUIT

(75) Inventor: Yasutomo Yokoyama, Kyoto (JP)

(73) Assignee: Rohm Co., Ltd. (JP)

( * ) Notice: Subject to any disclaimer, the term of this patent is extended or adjusted under 35 U.S.C. 154(b) by 914 days.

(21) Appl. No.: 12/687,329

(22) Filed: Jan. 14, 2010

(65) Prior Publication Data

US 2010/0195846 A1 Aug. 5, 2010

(30) Foreign Application Priority Data

Jan. 14, 2009 (JP) .................................. 2009-006075
Dec. 4, 2009 (JP) ................................ 2009-276814

(51) Int. Cl.
*H03G 3/00* (2006.01)

(52) U.S. Cl.
USPC ......................................... 381/107; 381/108

(58) Field of Classification Search
USPC ............. 381/104, 107, 108, 102, 1, 2, 17, 18, 381/309, 310, 56–59, 97
See application file for complete search history.

(56) References Cited

U.S. PATENT DOCUMENTS

| | | | | |
|---|---|---|---|---|
| 5,369,711 A * | 11/1994 | Williamson, III | ............ | 381/104 |
| 5,631,714 A | 5/1997 | Saadoun | | |
| 5,822,442 A * | 10/1998 | Agnew et al. | ................. | 381/107 |
| 5,903,655 A * | 5/1999 | Salmi et al. | .................... | 381/321 |
| 7,551,745 B2 * | 6/2009 | Gundry et al. | ................ | 381/106 |
| 8,077,419 B1 * | 12/2011 | Pai et al. | ......................... | 360/65 |
| 8,315,410 B2 * | 11/2012 | Magrath | ....................... | 381/107 |
| 8,315,411 B2 * | 11/2012 | Hanna et al. | .................. | 381/107 |
| 2002/0154786 A1 * | 10/2002 | Waller, Jr. | ..................... | 381/104 |
| 2004/0258246 A1 * | 12/2004 | Tanghe | ............................ | 381/1 |
| 2005/0117757 A1 * | 6/2005 | Okimoto et al. | ............. | 381/102 |
| 2008/0008336 A1 * | 1/2008 | Tanaka et al. | ................. | 381/104 |
| 2009/0046872 A1 * | 2/2009 | Vollmer | ......................... | 381/102 |
| 2009/0074209 A1 * | 3/2009 | Thompson et al. | ........... | 381/107 |

FOREIGN PATENT DOCUMENTS

| | | |
|---|---|---|
| JP | 63217810 A | 9/1988 |
| JP | 11220345 A | 8/1999 |
| JP | 2008252939 A | 10/2008 |

OTHER PUBLICATIONS

Notification of Reasons for Refusal for Japanese Patent Application No. 2009-276814; Date of Mailing: Jul. 16, 2013, with English Translation.

* cited by examiner

*Primary Examiner* — Vivian Chin
*Assistant Examiner* — David Ton
(74) *Attorney, Agent, or Firm* — Cantor Colburn LLP (57) ABSTRACT

A variable gain amplifier amplifies an input audio signal. A first control unit monitors the level of the input audio signal, and sets the gain of the variable gain amplifier to a predetermined fixed value when this level is lower than a predetermined minimum threshold. A second control unit monitors the level of an output signal VO of the variable gain amplifier. When this level exceeds a predetermined maximum threshold, the second control unit lowers the gain of the variable gain amplifier. When this level becomes smaller than this threshold, it raises the gain. When the level of the input audio signal is smaller than the minimum threshold, the first control unit disables the gain control operation of the variable gain amplifier controlled by the second control unit. A sub-amplifier amplifies the input audio signal. An output mixing unit mixes signals output from the variable gain amplifier and the sub-amplifier.

7 Claims, 5 Drawing Sheets

AUTOMATIC LEVEL CONTROL CIRCUIT

BACKGROUND OF THE INVENTION

1. Field of the Invention

The present invention relates to an automatic level control circuit which adjusts the signal level of an analog audio signal.

2. Description of the Related Art

Apparatuses such as TVs, car audio systems, home theater systems, and audio components, which output sound (audio signals) have a function for automatically controlling the volume of the audio signal (ALC: Automatic Level Control) so as to allow listeners/viewers to easily listen to the audio. ALC allows the level of a quiet sound to be raised, and allows the level of a loud sound to be reduced, in a case in which the dynamic range of the audio signal is very large. Also, ALC is effective in a case in which there is a great difference in volume between television programs and commercials.

In general, such an ALC circuit has a configuration including a variable gain amplifier configured to amplify an audio signal and a control unit configured to monitor the level (amplitude) of the audio signal input to the variable gain amplifier, and to control the gain of the variable gain amplifier according to the level thus monitored.

RELATED ART DOCUMENTS

Patent Documents

[Patent Document 1]
U.S. Pat. No. 5,631,714A Specification

SUMMARY OF THE INVENTION

The present invention has been made in view of such a situation. Accordingly, it is a comprehensive purpose of the present invention to provide an ALC circuit which is capable of controlling a volume in a flexible manner.

An embodiment of the present invention relates to an automatic level control circuit. The automatic level control circuit comprises: a variable gain amplifier configured to amplify an input audio signal; and a first control unit configured to monitor the level of the input audio signal, and to set the gain of the variable gain amplifier to a predetermined fixed value when the level is lower than a predetermined minimum threshold value.

A signal having a level smaller than the minimum threshold value can be assumed to be a signal having a relatively high noise component ratio, or to essentially be noise. By setting the gain of the variable gain amplifier to a predetermined fixed value when the input signal level is smaller than the minimum threshold value, such an embodiment prevents noise from being unnecessarily amplified.

Also, the automatic level control circuit according to an embodiment may further comprise a second control unit configured to monitor the level of the output signal of the variable gain amplifier, to lower the gain of the variable gain amplifier when the level of the output signal of the variable gain amplifier exceeds a predetermined maximum threshold value, and to raise the gain of the variable gain amplifier when the level of the output signal of the variable gain amplifier becomes smaller than the maximum threshold value. When the level of the input audio signal is smaller than the minimum threshold value, the first control unit may disable the gain control operation of the variable gain amplifier controlled by the second control unit.

Such an embodiment is capable of setting the upper limit of the level of the output signal of the variable gain amplifier to the fixed maximum threshold value. Furthermore, in a region where the level of the input signal is lower than the minimum threshold value, such an embodiment is capable of setting the gain of the variable gain amplifier to a predetermined fixed value, thereby suppressing amplification of noise.

Also, the automatic level control circuit according to an embodiment may further comprise: a sub-amplifier configured to amplify the input audio signal; and an output mixing unit configured to mix the output signal of the variable gain amplifier and the output signal of the sub-amplifier.

Such an arrangement is capable of shifting the level of the output signal of the automatic level control circuit.

Also, when the level of the input audio signal is smaller than the minimum threshold value, the first control unit may set the gain of the sub-amplifier to zero.

With such an arrangement, in a region where the level of the input signal is lower than the minimum threshold value, the overall gain of the automatic level control circuit can be set to a predetermined fixed value, thereby suppressing amplification of noise.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

Figure 1:
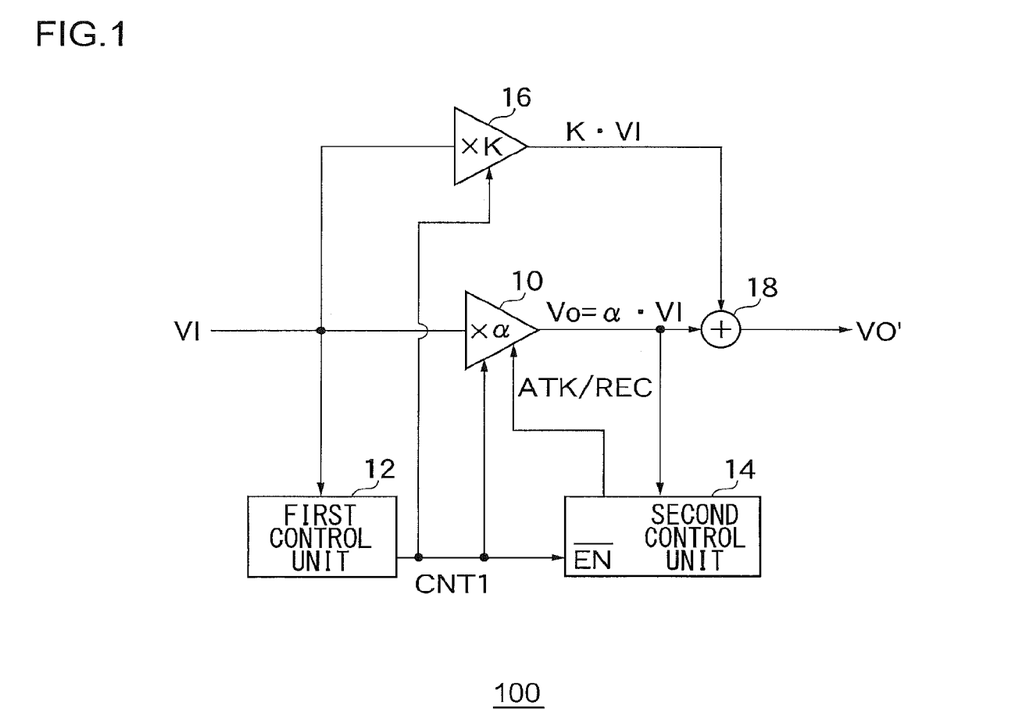
FIG. 1 is a block diagram which shows a configuration of an ALC circuit according to an embodiment of the present invention.

FIG. 1 is a block diagram which shows a configuration of an ALC circuit 100 according to an embodiment of the present invention. For example, a variable gain amplifier 10 is mounted on an electronic device having an audio output function, examples of which include TVs, car audio systems, etc. The variable gain amplifier 10 receives an analog audio signal from a playback unit (not shown) provided as an upstream component, adjusts the level thereof, and outputs the analog audio signal thus adjusted to an electroacoustic transducer (not shown) such as speakers or headphones provided as a downstream component.

The ALC circuit 100 includes the variable gain amplifier 10, a first control unit 12, a second control unit 14, a sub-amplifier 16, and an output mixing unit 18.

The variable gain amplifier 10 amplifies an input audio signal VI with a gain $\alpha$. The output signal VO of the variable gain amplifier 10 is represented by the Expression VO=$\alpha$·VI. For example, the gain $\alpha$ is set to a value selected from among discrete values ranging from $-\infty$ to +24 dB. The first control unit 12 monitors the level of the input audio signal VI. When the level of the input audio signal VI is smaller than a predetermined minimum threshold VImin, the first control unit 12 sets the gain $\alpha$ to a predetermined fixed value $\alpha$1. For example, the predetermined value $\alpha$1 is 1 (=0 dB). When VI is smaller than VImin, the variable gain amplifier 10 asserts a control signal CNT1. When the control signal CNT1 is asserted, the gain $\alpha$ of the variable gain amplifier 10 is set to the predetermined value $\alpha$1.

The second control unit 14 monitors the level of an output signal VO (=$\alpha$·VI). When the level of the output signal VO exceeds a predetermined maximum threshold VOmax, the second control unit 14 lowers the gain $\alpha$ of the variable gain amplifier 10 (attack operation), and when the level of the output signal VO becomes smaller than the maximum threshold VOmax, the second control unit 14 raises the gain $\alpha$ of the variable gain amplifier 10 (recovery operation). For example, when the level of the output signal VO reaches the maximum threshold VOmax, the second control unit 14 asserts an attack signal ATK, but when the level of the output signal VO becomes smaller than the maximum threshold VOmax, the second control unit 14 asserts a recovery signal REC. When the attack signal ATK is asserted, the variable gain amplifier 10 lowers the gain $\alpha$ by a predetermined step, and when the recovery signal REC is asserted, the variable gain amplifier 10 raises the gain $\alpha$ by a predetermined step. By employing the second control unit 14 and the variable gain amplifier 10, such an arrangement maintains the level of the output signal of the variable gain amplifier 10 at a constant value regardless of the level of the input signal. The configuration of the second control unit 14 can be made using techniques for conventional ALC circuits or AGC (Automatic Gain Control) circuits, and is not restricted by the present invention in particular.

Furthermore, the second control unit 14 is configured so as to be capable of switching the gain control operation of the variable gain amplifier 10 between the ON state and the OFF state. When a control signal input to an enable terminal EN# ("#" represents logical inversion) is asserted, the gain control operation of the variable gain amplifier 10 is stopped, and when the control signal CNT1 is negated, the variable gain amplifier 10 executes the gain control operation. That is to say, when the level of the input audio signal VI becomes smaller than the minimum threshold VImin, and the control signal CNT1 is asserted, the gain control operation of the variable gain amplifier 10 is disabled by the second control unit 14.

The sub-amplifier 16 amplifies the input audio signal VI with a gain K. The output signal of the sub-amplifier 16 is represented by the Expression K·VI. The output mixing unit 18 mixes (adds together) the output VO of the variable gain amplifier 10 and the output signal of the sub-amplifier 16. The output VO' of the output mixing unit 18 is represented by the Expression VO'=$\alpha$·VI+K·VI. The output signal VO' is used as the total output of the ALC circuit 100.

When the level of the input audio signal VI is smaller than the minimum threshold value VImin, the first control unit 12 sets the gain K of the sub-amplifier 16 to zero. Specifically, the control signal CNT1 output from the first control unit 12 is input to the sub-amplifier 16. When the control signal CNT1 is asserted, the gain K of the sub-amplifier 16 is set to zero. In order to set the gain K to zero, the power supply for the sub-amplifier 16 may be turned off, or the level of the output signal of the sub-amplifier 16 may be fixedly set to zero. When the control signal CNT1 is negated, the gain K of the sub-amplifier 16 is set to a predetermined value K1. The predetermined value K1 can be preferably set according to a command received from an unshown processor or the like.

Figure 2:
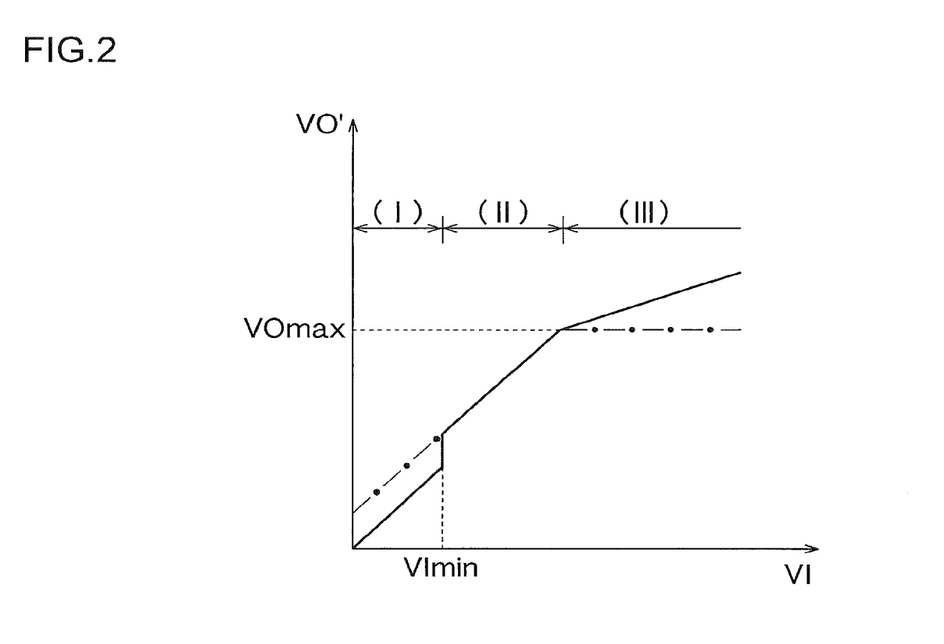
FIG. 2 is a graph which shows the input/output properties of the ALC circuit shown in FIG. 1.

The above is the configuration of the ALC circuit 100. Next, description will be made regarding the operation thereof. FIG. 2 is a graph which shows the input/output properties of the ALC circuit 100 shown in FIG. 1. The horizontal axis represents the level of the input audio signal VI of the ALC circuit 100. The vertical axis represents the level of the output audio signal VO' of the ALC circuit 100. The operation of the ALC circuit 100 can be understood by classifying the operation into three regions (I) through (III) according to the levels of the input audio signal VI and the output audio signal VO'.

1. Region (I)

In region (I), where VI<VImin, the gains $\alpha$ and K are set to $\alpha$1 and 0, respectively. Accordingly, the relation VO'=VI is satisfied. That is to say, it is assumed that the noise component is dominant in a region in which the level of the input audio signal VI is sufficiently small. In this case, the amplitude of the noise can be reduced by lowering the amplification gain of the signal.

2. Region (II)

When the level of the input audio signal VI exceeds the minimum threshold VImin, i.e., when the level of the input audio signal VI becomes greater than the noise level, the control signal CNT is negated, and the second control unit 14 starts the automatic gain control operation of the variable gain amplifier 10. In the region (II), in which the level of the input audio signal VI is greater than the maximum threshold VImin and the output signal VO of the variable gain amplifier 10 is smaller than the maximum threshold level VOmax, the gain $\alpha$ changes over time. However, because the recovery operation is repeatedly performed, the gain $\alpha$ would finally converge on the maximum value (24 dB) which can be set.

3. Region (III)

When the output signal VO of the variable gain amplifier 10 reaches the maximum threshold VOmax, the attack operation begins, thereby maintaining the output signal VO of the variable gain amplifier 10 at a constant level (region (III)). The total output audio signal VO' of the ALC circuit 100 is represented by the sum of the output signal VO of the variable gain amplifier 10 and the output signal of the sub-amplifier 16. Accordingly, in the region (III), while the level of the output signal of the variable gain amplifier 10 is maintained at a constant value, the gain K of the sub-amplifier 16 is set to a value K1 which is not zero. Thus, such an arrangement is capable of increasing the level of the output audio signal VO' according to an increase in the level of the input audio signal VI. In other words, the predetermined value K1 to be set as the gain K of the sub-amplifier 16 should be set according to the slope of the curve of the output audio signal VO' in the region (III). It should be noted that K1 may be set to zero. With such an arrangement, the output audio signal VO' can be maintained at a constant level in the region (III).

The advantage of the ALC circuit 100 shown in FIG. 1 can be more clearly understood by making comparison with conventional ALC circuits. A line of dots and dashes is shown in FIG. 2, which represents the input/output properties of a conventional ALC circuit which performs the automatic level control operation for the variable gain amplifier 10 based upon the level of the input audio signal VI. With such a type of ALC circuit, in a case in which the input audio signal VI is input at the noise level over a long period of time, the recovery operation is repeatedly performed, leading to an increase in the gain. This leads to a problem of amplified noise being output from speakers and headphones. On the other hand, with the ALC circuit 100 shown in FIG. 1, because amplification of noise is suppressed, high quality audio playback can be provided.

Furthermore, with conventional ALC circuits, when the level of the input audio signal VI increases to a certain level, the level of the output audio signal VO' is set to a predetermined fixed level. On the other hand, with the ALC circuit 100 shown in FIG. 1 including the sub-amplifier 16, the level of the output audio signal VO' can be changed according to an increase in the level of the input audio signal VI while clamping the output level of the variable gain amplifier 10.

Next, description will be made regarding a digital surround processing unit (audio DSP) including the ALC circuit 100 shown in FIG. 1.

Figure 3:
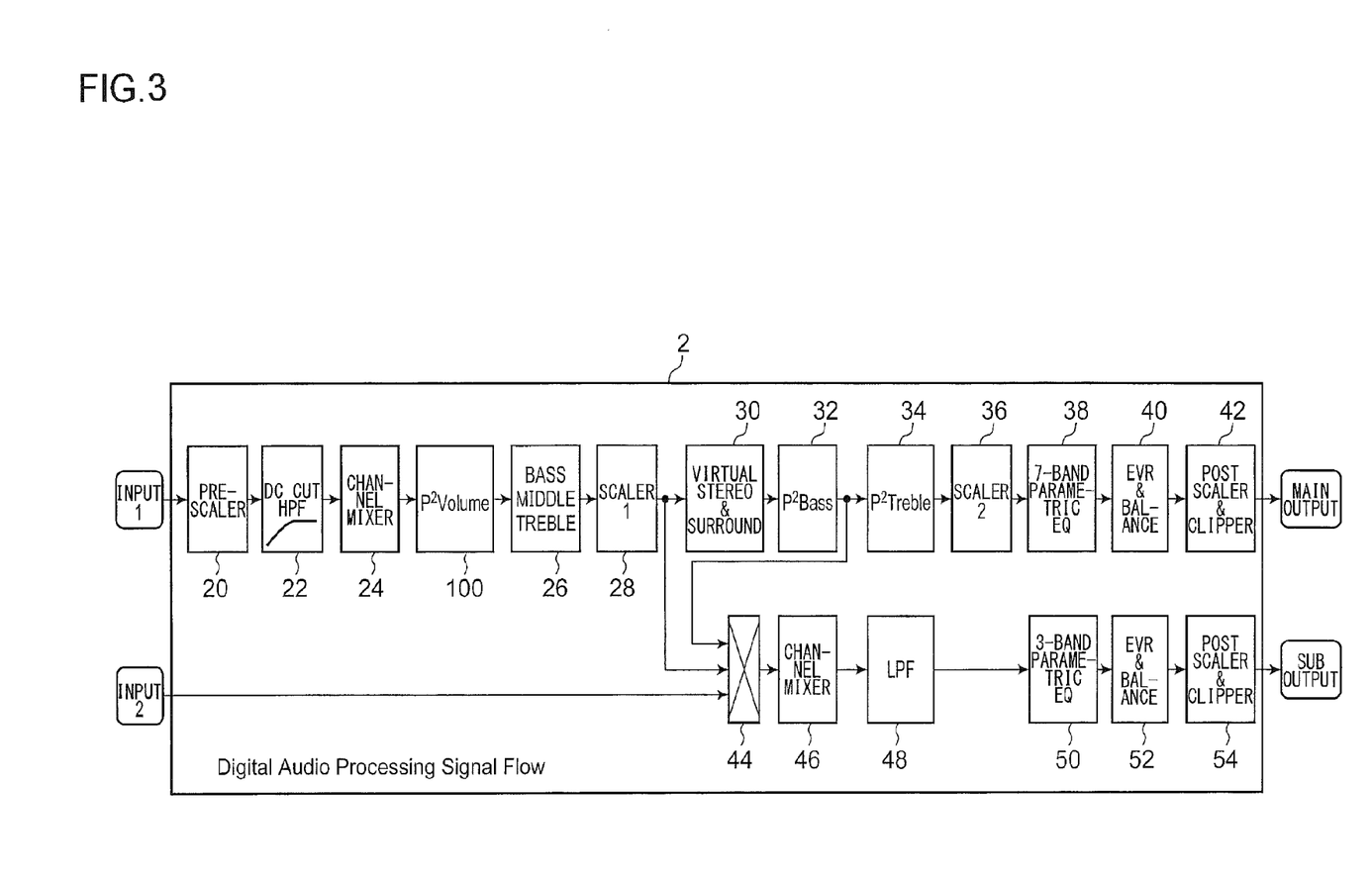
FIG. 3 is a block diagram which shows a configuration of an audio DSP including the ALC circuit shown in FIG. 1.

FIG. 3 is a block diagram which shows a configuration of a digital surround processing unit (which will be referred to as an "audio DSP") 2 including the ALC circuit 100 shown in FIG. 1. The digital surround processing unit 2 is mounted on thin-screen TVs, for example, and performs various kinds of signal processing on an audio signal. The audio DSP 2 includes the following blocks.

1. Prescaler 20

In some cases, a digital signal to be input to the digital surround processing unit 2 is at a full-scale level. In this case, the surround processing or equalizing processing leads to signal overflow. A prescaler 20 adjusts the input gain to be set for the input signal. The prescaler 20 is capable of adjusting the input gain in a range from +24 dB to −103 dB in increments of 0.5 dB.

2. HPF 22

An HPF 22 is a filter which removes the DC offset component of a digital signal input to the audio DSP 2. The HPF 22 is a primary filter with a cutoff frequency of 1 Hz, for example.

3. Channel Mixer 24

A channel mixer 24 performs audio mixing setting processing for the left channel L and the right channel R of the digital signal input to the audio DSP 2. The channel mixer 24 converts a stereo signal into a monaural signal.

4. $P^2$Volume (Perfect Pure Volume) 100

A $P^2$Volume 100 is a unit that corresponds to the ALC circuit 100 shown in FIG. 1.

5. Tone Control Unit 26

5.1 Bass

A peaking filter or a low shelf filter can be employed. Upon inputting the frequency value f0, Q value, and gain value Gain, the coefficients of a digital filter are calculated in an IC, and the coefficients thus calculated are transmitted to coefficient RAM which stores these coefficients. Such a soft switching function prevents the occurrence of shocking sounds in the setting operation.

5.2 Middle

A peaking filter can be employed. Upon inputting the frequency value f, Q value, and gain value Gain, the coefficients of a digital filter are calculated in an IC, and the coefficients thus calculated are transmitted to coefficient RAM which stores these coefficients. Such a soft switching function prevents shocking sounds from occurring in the setting operation.

5.3 Treble

A peaking filter or a low shelf filter can be employed. Upon inputting the frequency value f, Q value, and gain value Gain, the coefficients of a digital filter are calculated in an IC, and the coefficients thus calculated are transmitted to coefficient RAM which stores these coefficients. Such a soft switching function prevents shocking sounds from occurring in the setting operation.

6. First Scaler 28

In order to prevent signal overflow from occurring in the audio DSP 2. The first scaler 28 adjusts the gain. Such an arrangement provides the gain adjusted in a range from +24 dB to −103 dB in increments of 0.5 dB.

7. Virtual Stereo Surround Processing Unit 30

7.1 Virtual Stereo Unit

Figure 4A:
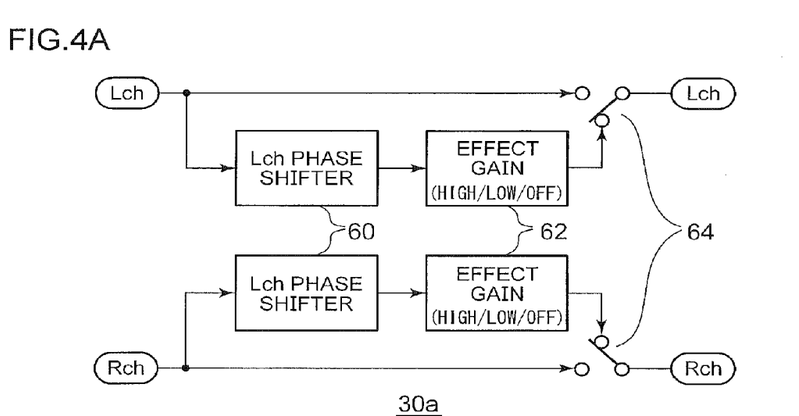
FIGS. 4A and 4B are block diagrams which show the configurations of a virtual stereo unit and a surround unit.

A virtual stereo unit performs signal processing on a monaural signal so as to reproduce stereo effects. The configuration is shown in FIG. 4A.

7.2 Surround Unit (Matrix Surround 3D)

Figure 4B:
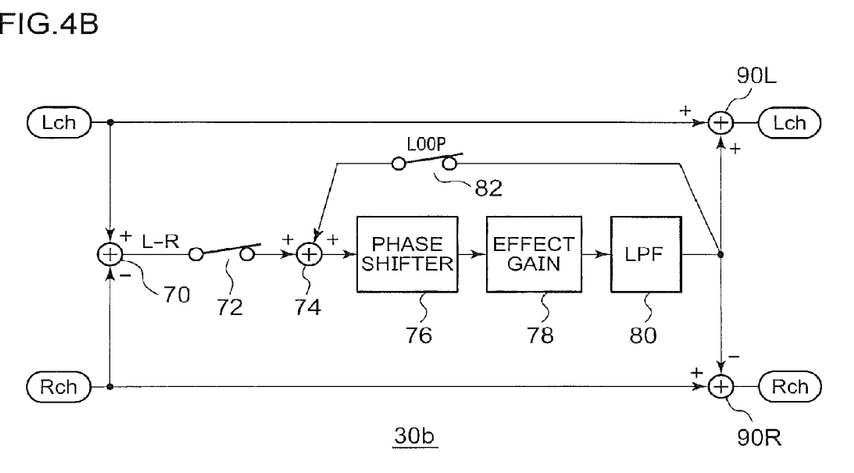

A surround unit is provided in order to provide a comfortable surround system having a wide sweet spot, which does not make the user feel tired even after viewing/listening for a long period of time. The surround unit reproduces sound naturally from the middle range to the high range, and provides a sound field in which the positioning of vocals is not harmed. The configuration thereof is shown in FIG. 4B. By performing a loop operation, the number of phase shifters can be virtually increased.

8. Deep Bass Equalizer ($P^2$Bass: Perfect Pure Bass) 32

A deep bass equalizer is an equalizer which enables even a thin-screen TV, which has the constraint of enclosed speakers, to reproduce intense deep bass sound and sound with a realistic fundamental tone extremely close to the original sound. Such an arrangement provides a heavy and clear deep bass sound with almost no distortion. Such an arrangement prevents interference between the bass sound and sound in the vocal range even if the bass sound is boosted, thereby providing a rich and natural deep bass sound.

9. Middle and High Range Equalizer ($P^2$Treble Perfect Pure Treble) 34

A middle and high range equalizer is included in order to provide clear, sharp sound that carries well. In a set that includes speakers below the display, it provides a sound enhancement effect.

10. Second Scaler 36

A second scaler 36 adjusts the gain in order to prevent signal overflow from occurring in the audio DSP 2. The second scaler 36 adjusts the gain. The gain can be adjusted in a range from +24 dB to −103 dB in increments of 0.5 dB.

11. 7-Band Parametric Equalizer 38

As a 7-band parametric equalizer 38, a peaking filter, a low shelf filter, or a high shelf filter can be employed. Upon inputting the frequency value f0, Q value, and gain value Gain, the coefficients of a digital filter are calculated in an IC, and the coefficients thus calculated are transmitted to coefficient RAM which stores these coefficients.

12. Main Output Electronic Volume 40

12.1 Main-Output EVR

The volume allows the gain to be selected in a range from +24 dB up to −103 B in increments of 0.5 dB. When the volume is switched, a soft switching operation is performed. When the gain is 0 dB, the soft switching time is approximately 22 ms.

12.2 Main Output Balance Unit

A balance unit allows the volume of the sound to be attenuated from the volume setting value in increments of 1 dB.

When the volume of the sound is switched, a soft switching operation is performed. The soft switching time is approximately 22 ms.

13. Main Output Post Scaler 42

13.1 Main Output Post Scaler

A main output post scaler is a unit which adjusts the level of the data before the data computed by a 32-bit DSP is output as 24-bit data. The level of the data can be adjusted in a range from +24 dB to −103 dB in increments of 0.5 dB.

13.2 Main Output Clipper

In order to measure the rated output (practical maximum output) of the TV, an audio signal having a 10% total harmonic distortion level (THD+N) is used. Such an arrangement having a clipper function allows the audio signal to be clipped to a desired output width. For example, such an arrangement provides a rated output of 10 W or 5 W using a 15-W output amplifier.

14. Sub-Input Data Selection Unit 44

A sub-input data selection unit 44 is a unit which selects a sub-input (sub-woofer processing etc.). The sub-input data selection unit 44 receives the data processed by the first scaler 28 and the data subjected to the P$^2$Bass processing or a digital signal (input 2) received from another path, and selects one input signal. When the sub-input data selection unit 44 selects the data subjected to the P$^2$Bass processing, such an arrangement provides sub-woofer output adjusted according to the P$^2$Bass gain setting.

15. Sub-Output Channel Mixer 46

A sub-output channel mixer 46 performs audio mixing setting processing for the left channel L and the right channel R of the digital signal input to the audio DSP 2. The sub-output channel mixer 46 converts a stereo signal into a monaural signal.

16. Sub-Output LPF 48

A sub-output LPF 48 is a crossover filter provided for the sub-woofer output.

17. Sub-Output 3-Band Parametric Equalizer 50

As a sub-output 3-band parametric equalizer 50, a peaking filter, a low shelf filter, or a high shelf filter can be employed. Upon inputting the frequency value f0, the Q value, and gain value Gain, the coefficients of a digital filter are calculated in an IC, and the coefficients thus calculated are transmitted to coefficient RAM which stores these coefficients.

18. Sub-Output Electronic Volume 52

18.1 Sub-Output EVR

A sub-output volume allows the gain to be selected in a range from +24 dB up to −103 dB in increments of 0.5 dB. When the volume is switched, a soft switching operation is performed. When the gain is 0 dB, the soft switching time is approximately 22 ms.

18.2 Sub-Output Balance Unit

A balance unit allows the volume of sound to be attenuated from the volume setting value in increments of 1 dB. When the volume of sound is switched, a soft switching operation is performed. The soft switching time is approximately 22 ms.

19. Sub-Output Post Scaler 54

A sub-output post scaler 54 is a unit which adjusts the level of the data before the data computed by a 32-bit DSP is output as 24-bit data. The level of the data can be adjusted in a range from +24 dB to −103 dB in increments of 0.5 dB.

19.2 Sub-Output Clipper

In order to measure the rated output (practical maximum output) of the TV, an audio signal having a 10% total harmonic distortion level (THD+N) is used. Such an arrangement having a clipper function allows the audio signal to be clipped to a desired output width. For example, such an arrangement provides a rated output of 10 W or 5 W using a 15-W output amplifier.

The above is the configuration of the audio DSP 2. Next, description will be made regarding the configuration of each unit.

FIGS. 4A and 4B are block diagrams which show the configurations of a virtual stereo unit and a surround unit. A virtual stereo unit 30a shown in FIG. 4A includes a phase shifter 60 which changes the phase of a signal, an amplifier 62 which amplifies the output signal of the phase shifter, and a selector 64 which selects either the output of the amplifier 62 or the original input signal.

Description will be made regarding a surround unit 30b shown in FIG. 4B. A subtractor 70 subtracts a right-channel signal Rch from a left-channel signal Lch. A switch 72 is provided between the subtractor 70 and an adder 74. The phase shifter 76 changes the phase of the output of the adder 74. The amplifier 78 amplifies the output of the phase shifter 76. An LPF 80 removes the high-frequency components of the output of the amplifier 78. The output of the LPF 80 is input to the adder 74 via a switch 82. An adder 90L adds together the left-channel signal Lch and the output of the LPF80. In the same way, an adder 90R adds together the right-channel signal Rch and the output of the LPF 80.

Figure 5A:
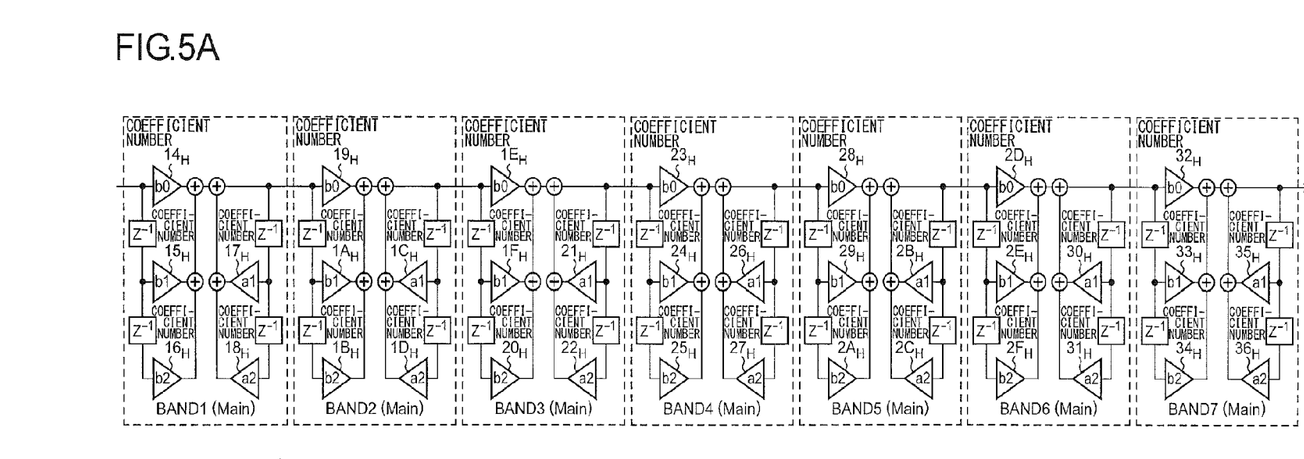
FIGS. 5A and 5B are block diagrams which show the configurations of a 7-band parametric equalizer and a sub-output 3-band parametric equalizer, respectively.
Figure 5B:
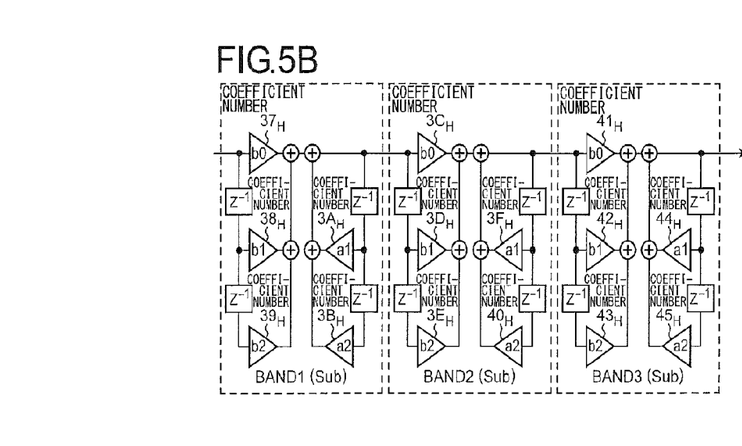

FIGS. 5A and 5B are block diagrams which show the configurations of a 7-band parametric equalizer 38 and a sub-output 3-band parametric equalizer 50. The 7-band parametric equalizer 38 and the sub-output 3-band parametric equalizer 50 are each quadratic IIR digital filters (Bi-quad Filters). Such a quadratic IIR digital filter has a configuration which allows the five coefficients of this filter, i.e., b0, b1, b2, a1, and a2, to be adjusted by an external circuit. By means of such a function, the filter format (other than peaking, low shelf, or high shelf), the frequency setting, the Q-value setting, and the gain setting, can be be set as desired.

The coefficients b0, b1, b2, a1, and a2 are stored in the coefficient RAM. The audio DSP 2 has an automatic update function for the coefficient RAM. Such a function allows the coefficient RAM to be automatically overwritten and updated.

While the preferred embodiments of the present invention have been described using specific terms, such description is for illustrative purposes only, and it is to be understood that changes and variations may be made without departing from the spirit or scope of the appended claims.

What is claimed is:

1. An automatic level control circuit comprising:
   a variable gain amplifier configured to amplify an input audio signal;
   a first control unit configured to monitor the level of the input audio signal, and to set the gain of the variable gain amplifier to a predetermined fixed value when the level is lower than a predetermined minimum threshold value;
   a sub-amplifier configured to amplify the input audio signal; and
   an output mixing unit configured to mix the output signal of the variable gain amplifier and the output signal of the sub-amplifier.

2. An automatic level control circuit according to claim 1, further comprising a second control unit configured to monitor the level of the output signal of the variable gain amplifier, to lower the gain of the variable gain amplifier when the level of the output signal of the variable gain amplifier exceeds a predetermined maximum threshold value, and to raise the gain of the variable gain amplifier when the level of the output signal of the variable gain amplifier becomes smaller than the maximum threshold value, wherein, when the level of the input audio signal is smaller than the minimum threshold value, the first control unit disables the gain control operation of the variable gain amplifier controlled by the second control unit.

3. An automatic level control circuit according to claim 1, wherein, when the level of the input audio signal is smaller than the minimum threshold value, the first control unit sets the gain of the sub-amplifier to zero.

4. An audio digital signal processor comprising:
an automatic level control circuit configured to adjust the level of an input audio signal;
a first scaler configured to adjust the level of the audio signal processed by the automatic level control circuit, in order to prevent signal overflow;
a main output electronic volume configured to adjust the volume of the signal processed by the first scaler; and
a main output balance unit configured to attenuate, from a volume setting value, the level of the signal processed by the main output electronic volume, wherein
the automatic level control circuit comprises:
a variable gain amplifier configured to amplify an input audio signal; and
a first control unit configured to monitor the level of the input audio signal, and to set the gain of the variable gain amplifier to a predetermined fixed value when the level is lower than a predetermined minimum threshold value.

5. An audio digital signal processor comprising:
a pre-scaler configured to adjust the level of an input audio signal so as to prevent signal overflow;
a high-pass filter configured to cut a DC offset component of the output of the pre-scaler;
a channel mixer configured to mix a left-channel component of the output of the high-pass filter and a right-channel component thereof; and
an automatic level control circuit configured to adjust the level of the output of the channel mixer, wherein
the automatic level control circuit comprises:
a variable gain amplifier configured to amplify an input audio signal; and
a first control unit configured to monitor the level of the input audio signal, and to set the gain of the variable gain amplifier to a predetermined fixed value when the level is lower than a predetermined minimum threshold value.

6. The audio digital signal processor according to claim 5, further comprising:
a sub-output channel mixer configured to receive sub-input data, and to mix a left-channel component and a right-channel component thereof;
a low-pass filter configured to remove a high-frequency component of the output of the sub-output channel mixer;
a parametric equalizer configured to equalize the output of the low-pass filter;
a sub-output electronic volume configured to adjust the volume of the output of the parametric equalizer; and
a sub-output balance unit configured to attenuate, from a setting value of the volume, the level of the output of the sub-output electronic volume.

7. A gain control method for a variable gain amplifier configured to amplify an input audio signal, comprising:
monitoring the level of the input audio signal, and setting the gain of the variable gain amplifier to a fixed value when the level of the input audio signal is smaller than a predetermined minimum threshold value;
monitoring the level of the output signal of the variable gain amplifier, lowering the gain of the variable gain amplifier when the level thus monitored exceeds a predetermined maximum threshold value, and raising the gain thereof when the level thus monitored becomes smaller than the maximum threshold value;
amplifying the input audio signal using a sub-amplifier which is arranged in parallel with the variable gain amplifier and which has a predetermined gain, and mixing the output signal of the variable gain amplifier and the output signal of the sub-amplifier; and
setting the gain of the sub-amplifier to zero when the level of the input audio signal is lower than the minimum threshold value.

* * * * *